US006774679B2

(12) United States Patent
Nogami

(10) Patent No.: US 6,774,679 B2
(45) Date of Patent: Aug. 10, 2004

(54) SEMICONDUCTOR INTEGRATED CIRCUIT

(75) Inventor: Kazutaka Nogami, Tokyo (JP)

(73) Assignee: Thine Electronics Inc., Tokyo (JP)

(*) Notice: Subject to any disclaimer, the term of this patent is extended or adjusted under 35 U.S.C. 154(b) by 0 days.

(21) Appl. No.: 10/333,021

(22) PCT Filed: May 28, 2002

(86) PCT No.: PCT/JP02/05159
§ 371 (c)(1),
(2), (4) Date: Jan. 15, 2003

(87) PCT Pub. No.: WO02/099971
PCT Pub. Date: Dec. 12, 2002

(65) Prior Publication Data
US 2003/0174003 A1 Sep. 18, 2003

(30) Foreign Application Priority Data
May 30, 2001 (JP) ......... 2001-162684

(51) Int. Cl.⁷ ......... G01R 25/00; H03D 13/00
(52) U.S. Cl. ......... 327/3; 327/19
(58) Field of Search ......... 327/2–3, 5, 12, 327/18–20, 26, 36–37, 146–150, 155–159; 375/374–376

(56) References Cited

U.S. PATENT DOCUMENTS 5,059,833 A  * 10/1991 Fujii ......... 327/7
5,315,186 A  *  5/1994 Baker ......... 327/3
5,592,125 A  *  1/1997 Williams ......... 331/1 A
6,515,525 B2 *  2/2003 Hasegawa ......... 327/156

FOREIGN PATENT DOCUMENTS

JP  50-156969 A  12/1975
JP  02-164128 A   6/1990
JP  05-206845 A   8/1993
JP  09-008655 A   1/1997

* cited by examiner

Primary Examiner—My-Trang Nuton
(74) Attorney, Agent, or Firm—Sughrue Mion, PLLC

(57) ABSTRACT

In a semiconductor integrated circuit including a phase comparator circuit for a PLL or DLL, overall lock precision of the PLL or DLL is improved by eliminating a dead zone of the phase comparator circuit and preventing output current offset of a charge pump circuit. The semiconductor integrated circuit includes a first circuit for activating a first phase difference signal corresponding to a phase difference between a first clock signal and a second clock signal when a phase of the first clock signal is delayed by more than a predetermined value in comparison with a phase of the second clock signal and activating a second phase difference signal corresponding to the phase difference when the phase of the first clock signal is advanced by more than a predetermined value in comparison with the phase of the second clock signal, a second circuit for activating a first pulse signal when an edge of the first clock signal is delayed in comparison with an edge of the second clock signal and activating a second pulse signal when the edge of the first clock signal is advanced in comparison with the edge of the second clock signal, a third circuit for combining the first phase difference signal and the first pulse signal, and a fourth circuit for combining the second phase difference signal and the second pulse signal.

7 Claims, 10 Drawing Sheets

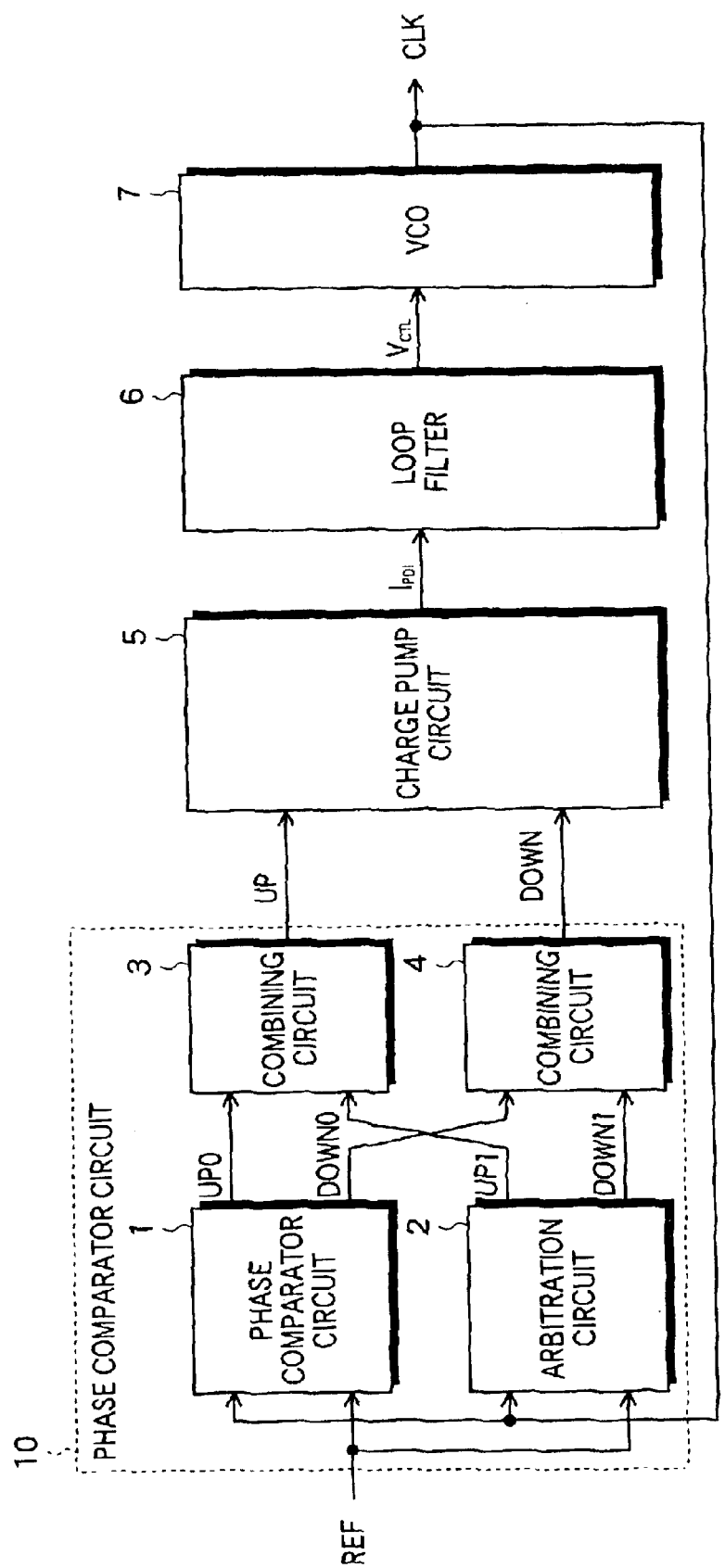

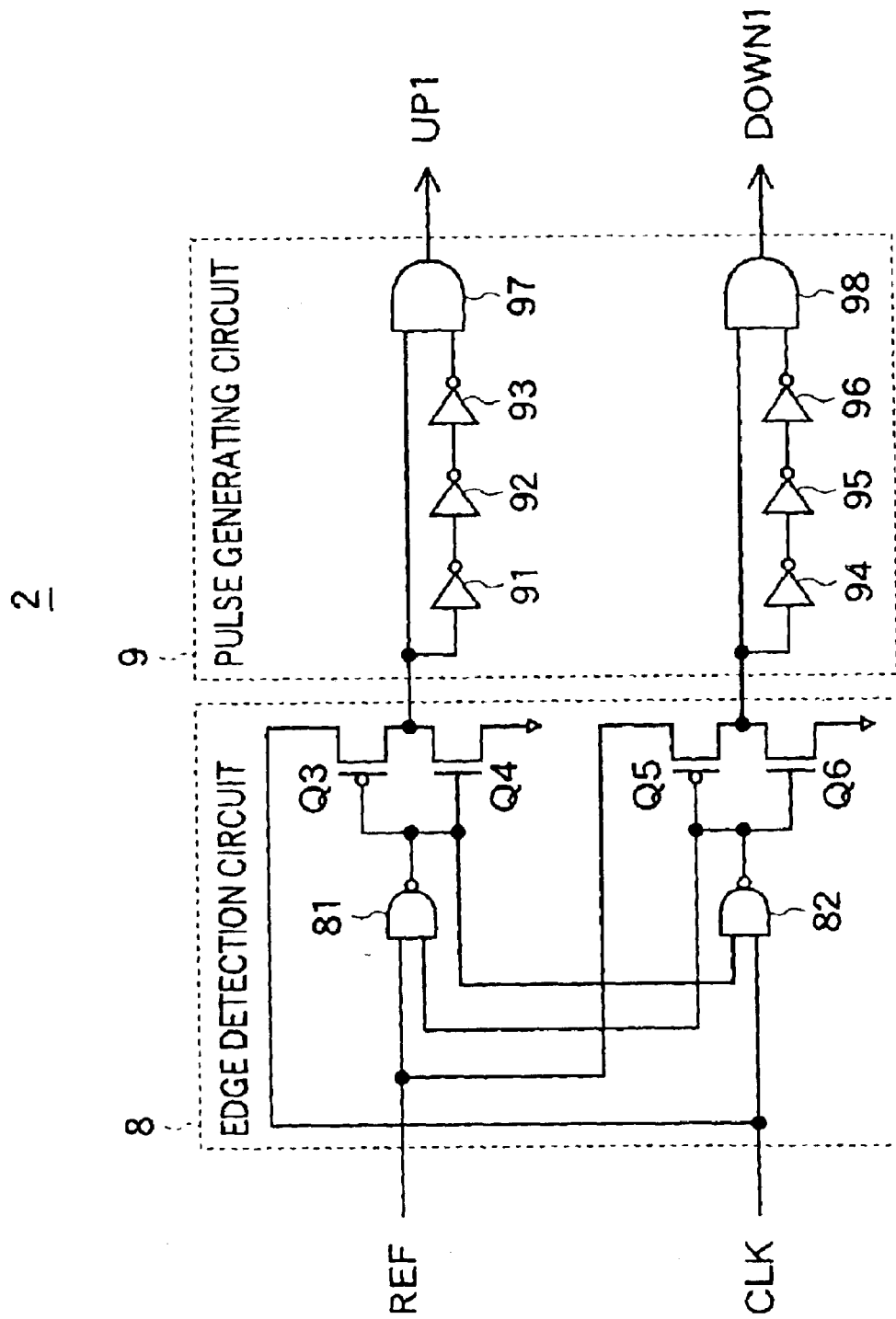

PHASE COMPARATOR CIRCUIT DEAD ZONE

SEMICONDUCTOR INTEGRATED CIRCUIT

TECHNICAL FIELD

The present invention relates to a semiconductor integrated circuit including a phase comparator circuit for detecting phase difference between two clock signals, and particularly to a semiconductor integrated circuit including a phase comparator circuit for a PLL (phase locked loop) or DLL (delay locked loop).

BACKGROUND ART

For example, in a reproducing circuit for reproducing recorded data or a receive circuit for receiving transmitted data, a PLL (phase locked loop) having a combination of a voltage controlled oscillator and a phase comparator circuit or a DLL (delay locked loop) having a combination of a voltage controlled delay element and a phase comparator circuit is used to generate a clock signal synchronized to input data.

The structure of a PLL circuit using a conventional phase comparator circuit is shown in FIG. 1. This PLL circuit comprises a phase comparator circuit 1 for comparing a phase of a reference clock signal REF and a phase of a clock signal CLK to output an UP signal or a DOWN signal depending on the phase difference, a charge pump circuit 5 for supplying output current $I_{PDI}$ according to the UP signal and DOWN signal output from the phase comparator circuit 1, a loop filter 6, having low pass characteristics, for converting output current $I_{PDI}$ of the charge pump circuit 5 to a control voltage $V_{CTL}$, and a VCO (voltage controlled oscillator) 7 oscillating at a frequency controlled by the control voltage $V_{CTL}$ to output a clock signal CLK.

The structure of the phase comparator circuit as shown in FIG. 1 is shown in FIG. 2. As shown in FIG. 2, the phase comparator circuit 1 comprises two flip flop circuits 11 and 12 and an AND circuit 13.

A high level signal "1" is supplied to data input terminals D of the flip flop circuits 11 and 12. The flip flop circuit 11 outputs a high level UP signal synchronized with the rising edge of the reference clock signal REF supplied to the clock input terminal CK, while the flip flop circuit 12 outputs a high level DOWN signal synchronized with the rising edge of the clock signal CLK supplied to the clock input terminal CK.

The AND circuit 13 provides a high level signal to the clear terminals CLR of the flip flop circuits 11 and 12 when both the UP signal and the DOWN signal become high levels. In this way, the flip flop circuits 11 and 12 are cleared and both the UP signal and the DOWN signal become low levels.

As a result, in the case where the phase of the clock signal CLK is delayed compared to the reference clock signal REF, the phase comparator circuit 1 outputs a high level UP signal from the rising edge of the reference clock signal REF to the rising edge of the clock signal CLK. On the other hand, if the phase of the clock signal CLK is advanced compared to the phase of the reference clock signal REF, the phase comparator circuit 1 outputs a high level DOWN signal from the rising edge of the clock signal CLK to the rising edge of the reference clock signal REF.

However, the minimum pulse width of the UP signal and the DOWN signal that can be output by the phase comparator circuit 1 is determined by the manufacturing technology used, and in the case where an absolute value of a phase difference between the clock signal CLK and the reference clock signal REF is less than that minimum pulse width, a dead zone exists where neither the UP signal or the DOWN signal are output. FIG. 3 shows a relationship between phase difference between the two clock signals and output current of the charge pump circuit when a dead zone exists in the phase comparator circuit.

In order to eliminate the dead zone of the phase comparator circuit 1, it has been considered to increase the delay time of the AND circuit 13. If this is done, in the event that a phase difference between the clock signal CLK and the reference clock signal REF is small, a pulse is output for both the UP signal and the DOWN signal and the charge pump circuit 5 can supply output current $I_{PDI}$ based on the width of these pulses. However, with respect to operation of the charge pump circuit 5, the following problems arise.

The structure of the charge pump circuit as shown in FIG. 1 is shown in FIG. 4. As shown in FIG. 4, the charge pump circuit 5 comprises an inverter 51 for inverting the UP signal, a P-channel transistor Q1 for supplying electrical current based on the inverted UP signal, an N-channel transistor Q2 for supplying electrical current based on the DOWN signal, and constant current sources 52 and 53. Here, the constant current sources 52 and 53 normally stop operating as constant current sources if a voltage greater than or equal to a specified voltage is not applied. If the constant current sources 52 and 53 do not operate as constant current sources, it is not possible to correctly balance current in the transistors Q1 and Q2.

Specifically, in the case where the transistor Q1 operates close to the power source voltage $V_{DD}$, a voltage applied to the constant current source 52 connected to transistor Q1 becomes small, and therefore, current flowing when the transistor Q1 is on becomes smaller than a steady value. Similarly, in the case where the transistor Q2 operates close to the power source voltage $V_{SS}$, a voltage applied to the constant current source 53 connected to transistor Q2 becomes small, and therefore, current flowing when the transistor Q2 is on becomes smaller than a steady value. In this way, in the event that the constant current sources 52 and 53 do not operate normally, then as shown in FIG. 5, at a position where the phase difference between the clock signal CLK and the reference clock signal REF becomes zero, the output current $I_{PDI}$ of the charge pump circuit 5 no longer becomes zero.

As described above, in the case where a dead zone exists in the characteristics of the phase comparator circuit, or where the constant current sources of the charge pump circuit do not operate normally even if there is no dead zone in the characteristic of the phase comparator circuit, there are problems such as jitter of the clock signal CLK becoming large and an offset arising in the phase of the clock signal CLK with respect to the reference clock signal REF.

DISCLOSURE OF THE INVENTION

In view of the above described situation, the object of the present invention is to improve overall lock precision of a PLL or DLL in a semiconductor integrated circuit including a phase comparator circuit for a PLL or DLL by preventing a dead zone of the phase comparator circuit and preventing output current offset of a charge pump circuit.

In order to achieve the above described object, a semiconductor integrated circuit according to the present invention comprises a first circuit for receiving a first clock signal and a second clock signal and for activating a first phase difference signal corresponding to a phase difference between the first clock signal and the second clock signal when a phase of the first clock signal is delayed by more than a predetermined value in comparison with a phase of the second clock signal and activating a second phase difference signal corresponding to the phase difference when the phase of the first clock signal is advanced by more than a predetermined value in comparison with the phase of the second clock signal, a second circuit for receiving the first clock signal and the second clock signal and for activating a first pulse signal when an edge of the first clock signal is delayed in comparison with an edge of the second clock signal and activating a second pulse signal when the edge of the first clock signal is advanced in comparison with the edge of the second clock signal, a third circuit for combining the first phase difference signal output from the first circuit and the first pulse signal output from the second circuit, and a fourth circuit for combining the second phase difference signal output from the first circuit and the second pulse signal output from the second circuit.

According to the present invention, by combining the first circuit having a dead zone with respect to detection of phase difference between the first clock signal and the second clock signal and the second circuit for determining whether the second clock signal edge is ahead of or behind the first clock signal edge, it is possible to get rid of the dead zone of the phase comparator circuit and to prevent output current offset of the charge pump circuit.

BRIEF DESCRIPTION OF THE DRAWINGS

Advantages and features of the present invention will become clear from reference to the following detailed description and drawings. In these drawings, the same reference numerals represent the same structural elements.

FIG. 6 is a block diagram of a PLL circuit using a phase comparator circuit included in a semiconductor integrated circuit according to a first embodiment of the present invention.

FIG. 7 is a circuit diagram showing the structure of an arbitration circuit shown in FIG. 6.

BEST MODE FOR CARRYING OUT THE INVENTION

Figure 1:
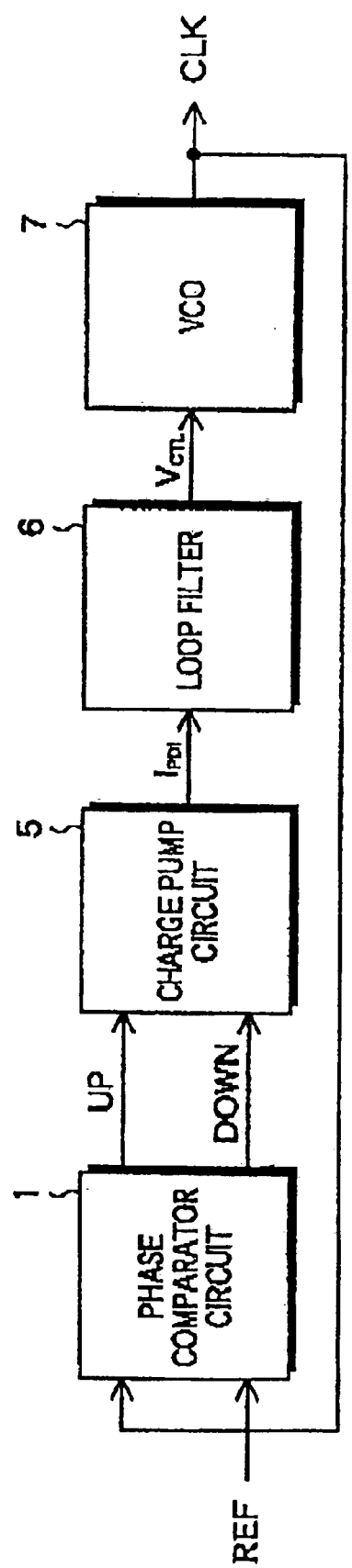
FIG. 1 is a block diagram showing the structure of a PLL circuit using a conventional phase comparator circuit.

FIG. 6 is a block diagram of a PLL circuit using a phase comparator circuit included in a semiconductor integrated circuit according to a first embodiment of the present invention.

As shown in FIG. 6, this PLL circuit comprises a phase comparator circuit 10 for comparing a phase of a reference clock signal REF and a phase of a clock signal CLK to output an UP signal and a DOWN signal depending on the phase difference, a charge pump circuit 5 for supplying output current $I_{PDI}$ according to the UP signal and DOWN signal output from the phase comparator circuit 10, a loop filter 6, having a low pass characteristic, for converting output current $I_{PDI}$ supplied from the charge pump circuit 5 to a control voltage $V_{CTL}$, and a VCO (voltage controlled oscillator) 7 for oscillating at a frequency controlled by the control voltage $V_{CTL}$ to output the clock signal CLK.

Here, the phase comparator circuit 10 comprises a phase comparator circuit 1 for comparing the phase of the reference clock signal REF with the phase of the clock signal CLK to output phase difference signals UP0 and DOWN0 depending on the phase difference, an arbitration circuit 2 for outputting a pulse signal UP1 when a rising edge of the clock signal CLK is delayed compared to a rising edge of the reference clock signal REF and outputting a pulse signal DOWN1 when the rising edge of the clock signal CLK is advanced compared to the rising edge of the reference clock signal REF, a combining circuit 3 for combining and outputting the phase difference signal UP0 and the pulse signal UP1, and a combining circuit 4 for combining and outputting the phase difference signal DOWN0 and the pulse signal DOWN1.

Figure 2:
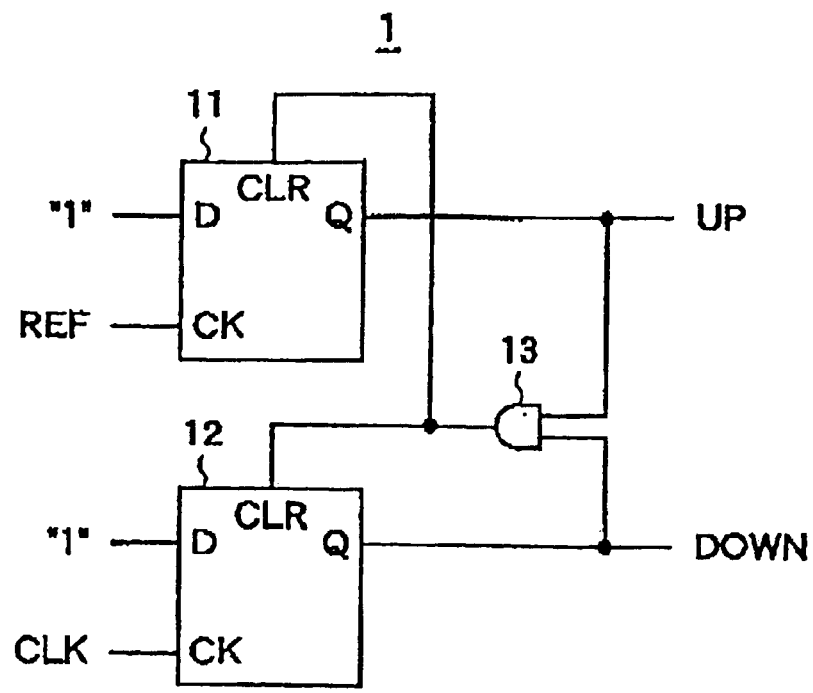
FIG. 2 is a circuit diagram showing the structure of the phase comparator circuit shown in FIG. 1

The phase comparator circuit 1 is the same as that shown in FIG. 2. If the phase of the clock signal CLK is delayed compared to the phase of the reference clock signal REF, the phase comparator circuit 1 outputs a high level UP signal from the rising edge of the reference clock signal REF until the rising edge of the clock signal CLK. On the other hand, if the phase of the clock signal CLK is advanced compared to the phase of the reference clock signal REF, the phase comparator circuit 1 outputs a high level DOWN signal from the rising edge of the clock signal CLK until the rising edge of the reference clock signal REF.

Figure 3:
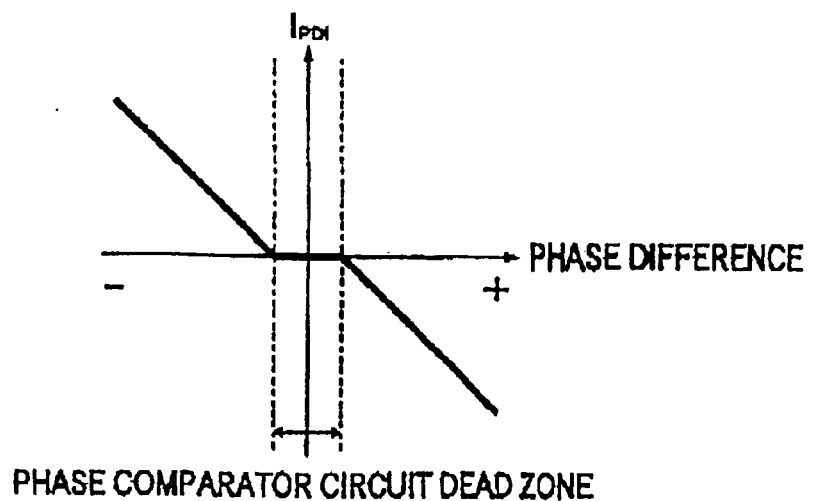
FIG. 3 is a drawing showing a relationship between phase difference of two clock signals and output current of a charge pump circuit when a dead zone exists in the phase comparator circuit.
Figure 4:
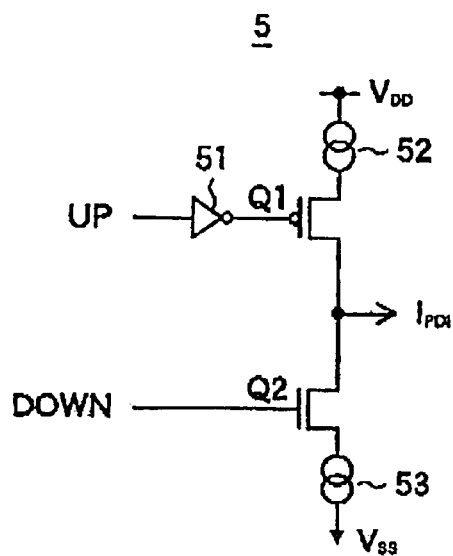
FIG. 4 is a circuit diagram showing the structure of a charge pump circuit shown in FIG. 1.
Figure 5:
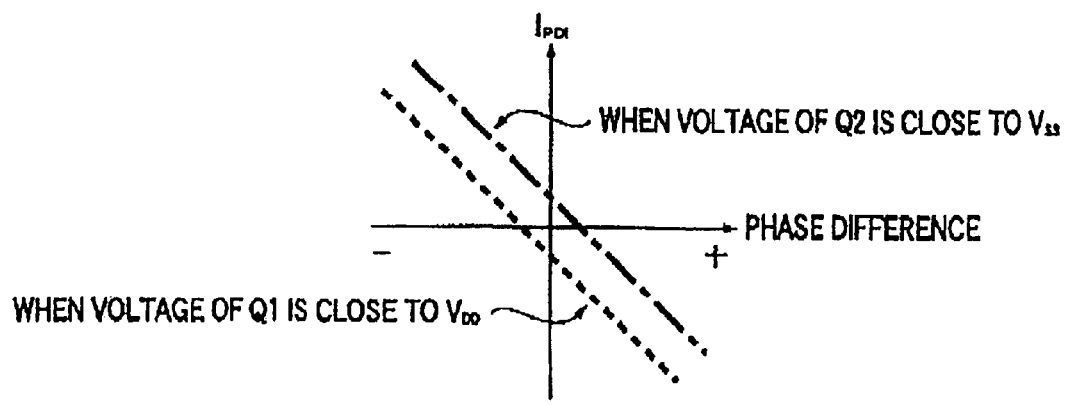
FIG. 5 is a drawing showing a relationship between phase difference of two clock signals and output current of a charge pump circuit when a constant current source is not operating normally.

In the phase comparator circuit 1, in the event that an absolute value of a phase difference between the clock signal CLK and the reference clock signal REF is less than or equal to the minimum pulse width that can be determined by the manufacturing technology, there is a dead zone where neither the UP signal or the DOWN signal are output (refer to FIG. 3). However, if the phase difference between the clock signal CLK and the reference clock signal REF is zero, since neither the UP signal or the DOWN signal are output, output current $I_{PDI}$ of the charge pump circuit 5 becomes zero and no offset occurs. The structure of the charge pump circuit 5 is the same as that shown in FIG. 4.

The structure of the arbitration circuit as shown in FIG. 6 is shown in FIG. 7. As shown in FIG. 7, the arbitration circuit 2 comprises an edge detection circuit 8 and a pulse generating circuit 9. The edge detection circuit 8 comprises NAND circuits 81 and 82, a first inverter made up of a P-channel transistor Q3 and an N-channel transistor Q4, and a second inverter made up of a P-channel transistor Q5 and an N-channel transistor Q6. Also, the pulse generating circuit 9 comprises inverters 91–96 and AND circuits 97 and 98.

Figure 8A:
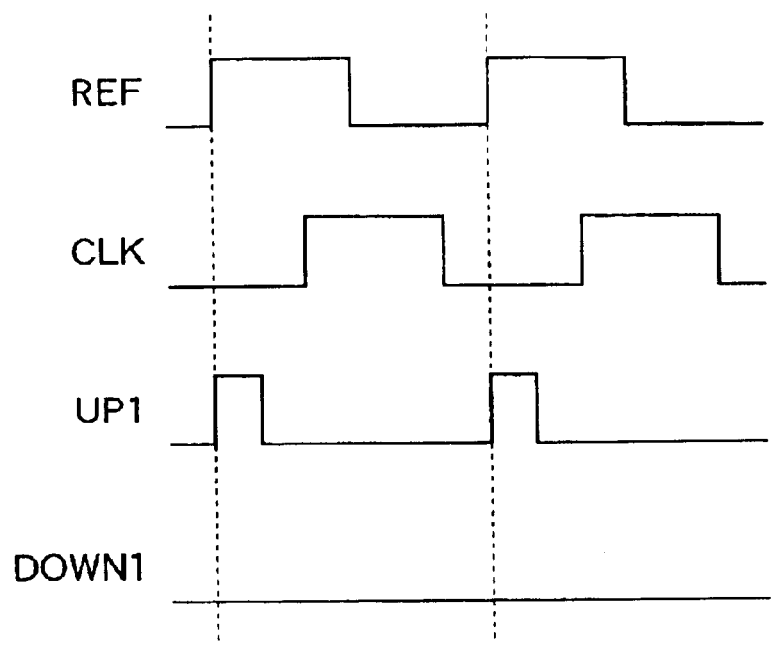
FIGS. 8A and 8B are timing charts showing waveforms of input signals of the arbitration circuit shown in FIG. 7.

A description will be given for the case where a rising edge of the reference clock signal REF is advanced compared to the rising edge of the clock signal CLK, as shown in FIG. 8A. If the reference clock signal REF becomes high level, output of the NAND circuit 81 becomes low level. Next, at the point in time where the clock signal CLK becomes a high level, the output of the first inverter becomes a high level. On the other hand, the output of the NAND circuit 81 is maintained at a high level. In this way, in the pulse generating circuit 9, a pulse signal UP1 having a pulse width corresponding to delay time of the inverters 91 to 93 is output from the AND circuit 97.

Figure 8B:
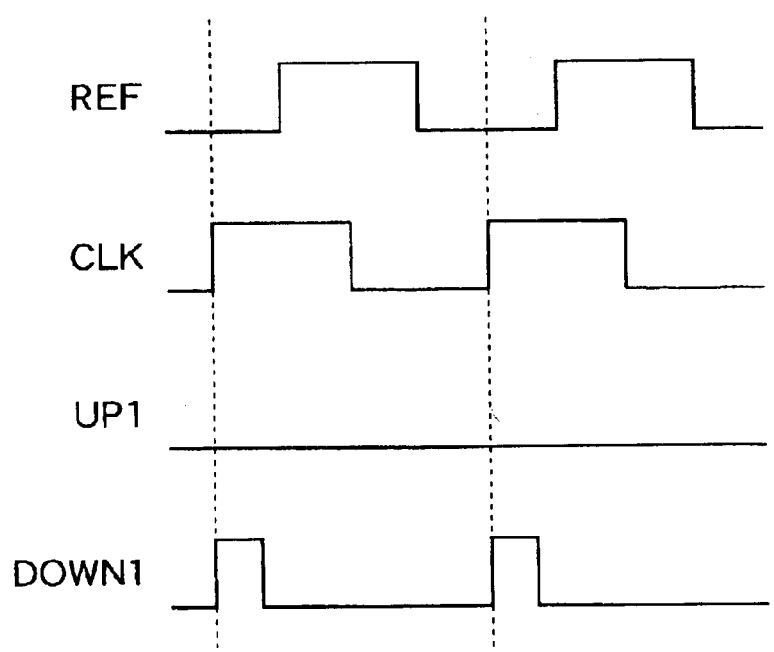

A description will be given for the case where a rising edge of the clock signal CLK is advanced compared to the rising edge of the reference clock signal REF, as shown in FIG. 8B. If the clock signal CLK becomes a high level, output of the NAND circuit 82 becomes a low level. Next, at the point in time where the reference clock signal REF becomes a high level, the output of the second inverter becomes a high level. On the other hand, the output of the NAND circuit 82 is maintained at a high level. In this way, in the pulse generating circuit 9, a pulse signal DOWN1 having a pulse width corresponding to delay time of the inverters 94–96 is output from the AND circuit 98.

Figure 9:
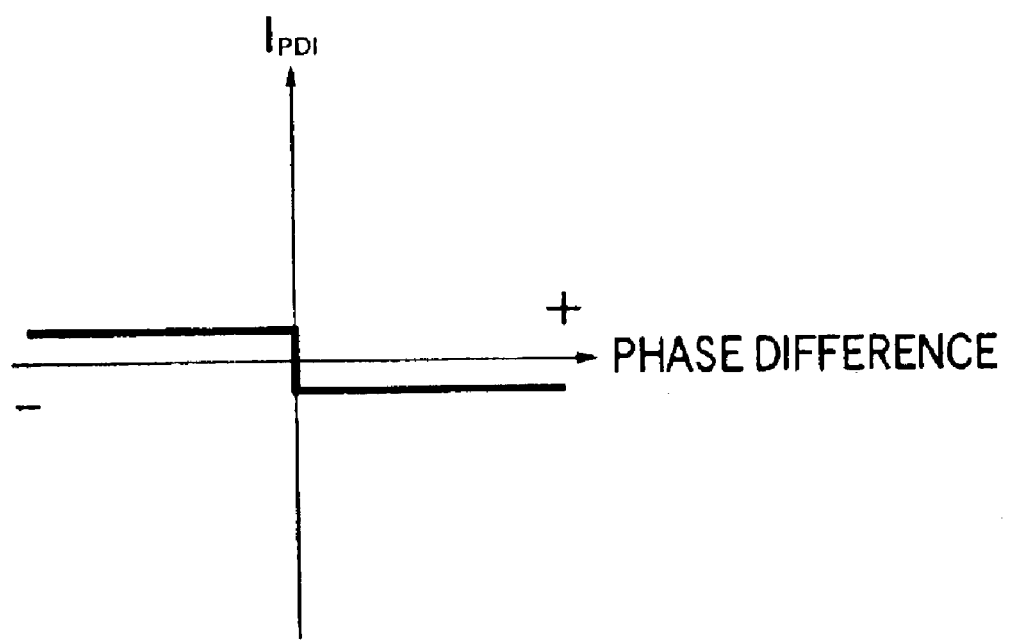
FIG. 9 is a drawing showing a relationship between phase difference of two clock signals and output current of the charge pump circuit when using the arbitration circuit shown in FIG. 7.

FIG. 9 shows a relationship between phase difference of two clock signals and output current of the charge pump circuit when using the arbitration circuit shown in FIG. 7. The arbitration circuit shown in FIG. 7 outputs a pulse signal having a fixed pulse width only in response to the order of the reference clock signal REF and the clock signal CLK. Accordingly, if this pulse signal is input to a charge pump circuit, the charge pump circuit outputs a positive constant current when the phase difference between the clock signal CLK and the, reference clock signal REF is negative, and outputs a negative constant current when the phase difference is positive.

Referring again to FIG. 6, in the phase comparator circuit 10, the phase difference signals UP0 and DOWN0 output from the phase comparator circuit 1 are respectively combined with the pulse signals UP1 and DOWN1 output from the arbitration circuit 2 by the combining circuits 3 and 4, to generate the UP signal and the DOWN signal. It is possible to use, for example, OR circuits as the combining circuits 3 and 4.

Waveforms of respective signals of the phase comparator circuit 10 shown in FIG. 6 are shown in FIGS. 10A–10D.

Figure 10:
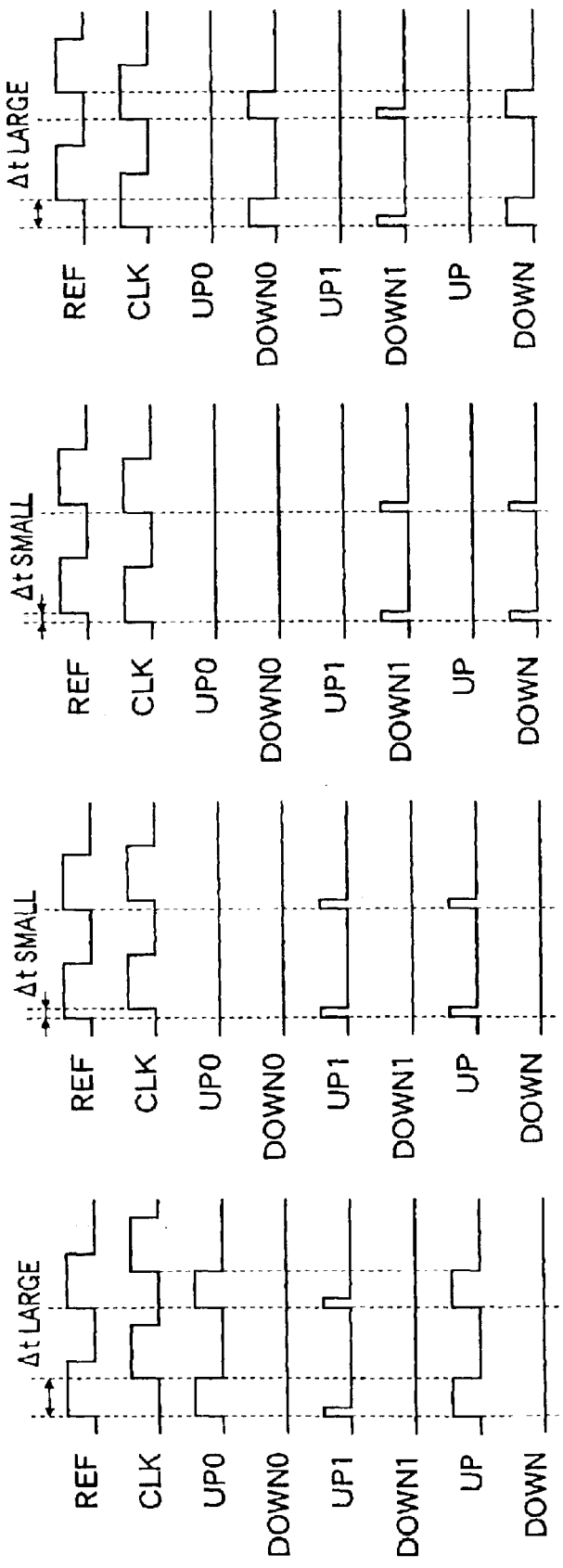
FIGS. 10A–10D are timing charts showing waveforms of respective signals in the phase comparator circuit shown in FIG. 6.

FIGS. 10A and 10B show waveforms of respective signals in the case where the phase of the reference clock signal REF is advanced compared to the phase of the clock signal CLK. In FIG. 10A, an absolute value Δt of phase difference is large and a period for which the UP signal is a high level is determined by the phase difference signal UP0. In FIG. 10B, an absolute value Δt of phase difference is small and a period for which the UP signal is a high level is determined by the pulse signal UP1.

FIGS. 10C and 10D show waveforms of respective signals in the case where the phase of the clock signal CLK is advanced compared to the phase of the reference clock signal REF. In FIG. 10C, an absolute value Δt of phase difference is small and a period for which the DOWN signal is a high level is determined by the pulse signal DOWN1. In FIG. 10D, an absolute value Δt of phase difference is large and a period for which the DOWN signal is a high level is determined by the phase difference signal DOWN0.

Figure 11:
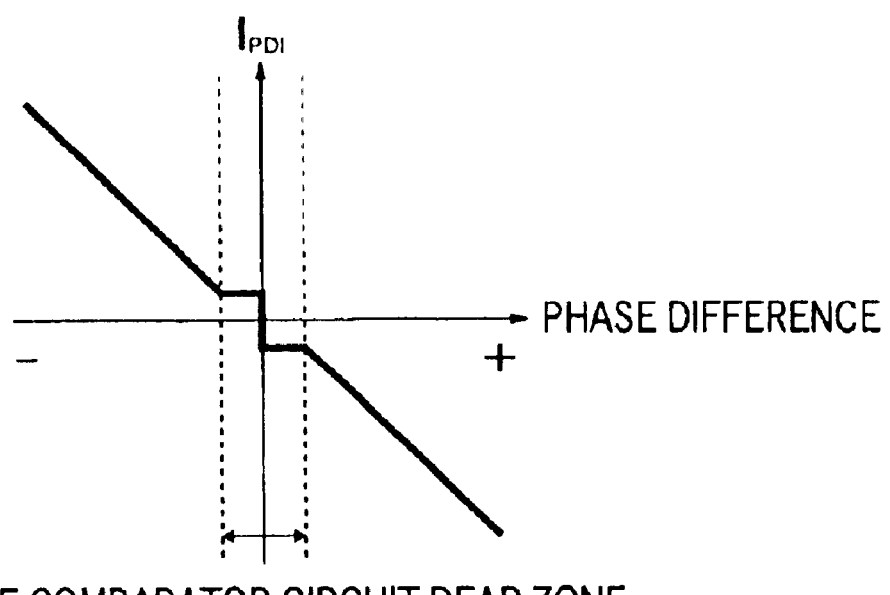
FIG. 11 is a drawing showing a relationship between phase difference of two clock signals and output current of the charge pump circuit when using the PLL circuit shown in FIG. 6.

By driving the charge pump circuit 5 using the UP signal and DOWN signal generated in this way, a relationship between phase difference of the two clock signals and output current of the charge pump circuit becomes a characteristic that is an addition of the characteristic shown in FIG. 3 and the characteristic shown in FIG. 9. FIG. 11 shows a relationship between the phase difference of the two clock signals and output current of the charge pump circuit for the PLL circuit shown in FIG. 6. Outside the dead zone of the phase comparator circuit 1, output current of the charge pump circuit varies in response to phase difference between the two clock signals, while inside the dead zone, polarity of the output current of the charge pump circuit is varied depending on whether the phase difference is positive or negative, owing to the characteristic of the arbitration circuit 2.

In this embodiment, by driving the charge pump circuit 5 using the phase comparator circuit 10, there is no dead zone where the output current of the charge pump circuit 5 becomes zero, no offset occurs in output current when the phase of the clock signal CLK and the phase of the reference clock signal REF are coincident. Accordingly, by converting output current $I_{PDI}$ supplied from the charge pump circuit 5 into a control voltage $V_{CTL}$ using the loop filter 6 and controlling the VCO 7 using this control voltage $V_{CTL}$, it is possible to realize a PLL that reduces jitter due to a dead zone of the phase comparator circuit and also a phase offset between the clock signal CLK and the reference clock signal REF.

Next, a second embodiment of the present invention will be described.

Figure 12:
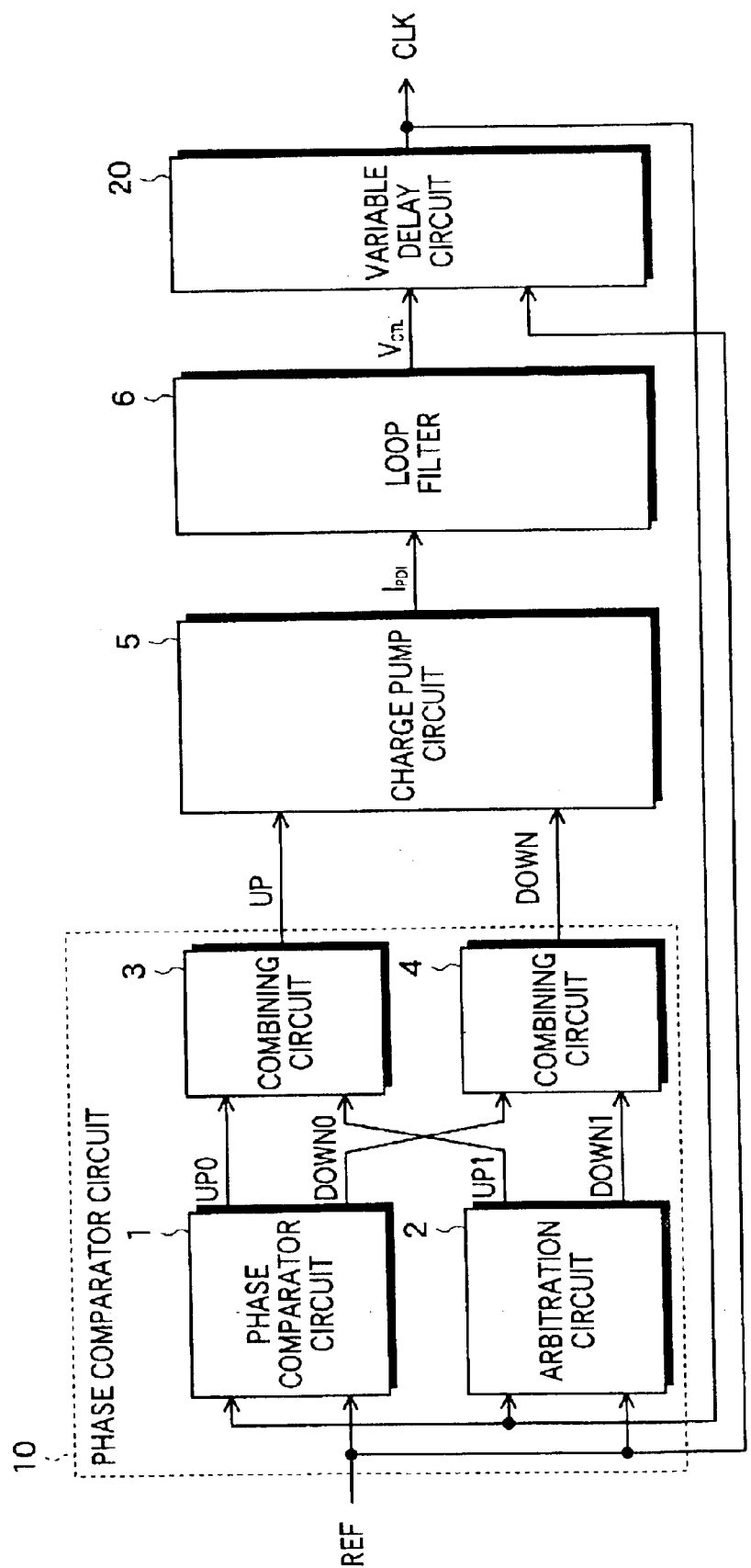
FIG. 12 is a block diagram of a DLL circuit using a phase comparator circuit included in a semiconductor integrated circuit according to a second embodiment of the present invention.

FIG. 12 is a block diagram of a DLL circuit using a phase comparator circuit contained in a semiconductor integrated circuit according to the second embodiment of the present invention. In this DLL circuit, a VCO 7 shown in FIG. 6 is replaced with a variable delay circuit 20.

This variable delay circuit 20 receives a reference clock REF as an input, delays the reference clock REF by a delay period that is controlled by a control voltage $V_{CTL}$ output from a loop filter 6, and outputs the delayed reference clock REF as a clock signal CLK. The variable delay circuit 20 can also be made up of a plurality of delay elements having a delay period controlled by a control voltage. In this case, it is possible to output a number of multiphase clock signals from these delay elements. The multiphase clock signals are used to decode high-speed serial-transmission data, for example.

In this embodiment, by driving the charge pump circuit 5 using the phase comparator circuit 10, there is no dead zone where the output current of the charge pump circuit 5 becomes zero, no offset occurs in output current when the phase of the clock signal CLK and the phase of the reference clock signal REF are coincident. Accordingly, by converting output current $I_{PDI}$ supplied from the charge pump circuit 5 into a control voltage $V_{CTL}$ using the loop filter 6 and controlling the variable delay circuit 20 using this control voltage $V_{CTL}$, it is possible to realize a DLL that reduces jitter due to a dead zone of the phase comparator circuit and also a phase offset between the clock signal CLK and the reference clock signal REF.

As has been described above, according to the present invention, in a semiconductor integrated circuit including a phase comparator circuit using a PLL or a DLL, it is possible to eliminate a dead zone of the comparator circuit and also to prevent offset of a charge pump circuit output current. In this way, it is possible to reduce jitter and offset of a clock signal, and to improve overall lock precision of a PLL or DLL.

The present invention has been described based on embodiments, but the present invention is not limited to the above described embodiments and various forms and modifications are possible within the range of the attached patent claims.

Industrial Applicability

The present inventions can be used in a PLL or DLL for generating a clock signal synchronized with input data.

What is claimed is:

1. A semiconductor integrated circuit, comprising:

a first circuit for receiving a first clock signal and a second clock signal and for activating a first phase difference signal corresponding to a phase difference between the first clock signal and the second clock signal when a phase of the first clock signal is delayed by more than a predetermined value in comparison with a phase of the second clock signal and activating a second phase difference signal corresponding to the phase difference when the phase of the first clock signal is advanced by more than a predetermined value in comparison with the phase of the second clock signal;

a second circuit for receiving the first clock signal and the second clock signal and for activating a first pulse signal when an edge of the first clock signal is delayed in comparison with an edge of the second clock signal and activating a second pulse signal when the edge of the first clock signal is advanced in comparison with the edge of the second clock signal;

a third circuit for combining the first phase difference signal output from said first circuit and the first pulse signal output from said second circuit; and a fourth circuit for combining the second phase difference signal output from said first circuit and the second pulse signal output from said second circuit.

2. A semiconductor integrated circuit according to claim 1, wherein said second circuit activates the first pulse signal for a fixed period regardless of the phase difference between the first clock signal and the second clock signal in the case where the edge of the first clock signal is delayed in comparison with the edge of the second clock signal and activates the second pulse signal for a fixed period regardless of the phase difference in the case where the edge of the first clock signal is advanced in comparison with the edge of the second clock signal.

3. A semiconductor integrated circuit according to claim 1, wherein said third circuit includes an OR circuit for subjecting the first phase difference signal output from said first circuit and the first pulse signal output from said second circuit to a logical OR operation, and said fourth circuit includes an OR circuit for subjecting the second phase difference signal output from said first circuit and the second pulse signal output from said second circuit to a logical OR operation.

4. A PLL (phase locked loop) circuit comprising a phase comparator means, said phase comparator means comprising:

a phase comparator circuit for receiving a first clock signal and a second clock signal and for activating a first phase difference signal corresponding to a phase difference between the first clock signal and the second clock signal when a phase of the first clock signal is delayed by more than a predetermined value in comparison with a phase of the second clock signal and activating a second phase difference signal corresponding to the phase difference when the phase of the first clock signal is advanced by more than a predetermined value in comparison with the phase of the second clock signal;

an arbitration circuit for receiving the first clock signal and the second clock signal and for activating a first pulse signal whdn an edge of the first clock signal is delayed in comparison with an edge of the second clock signal and activating a second pulse signal when the edge of the first clock signal is advanced in comparison with the edge of the second clock signal, said arbitration circuit comprising an edge detection circuit for detecting a rising edge of one of the first and second clock signals being advanced and a pulse generating circuit for generating one of the first and second pulse signals;

a first combining circuit for combining the first phase difference signal output from said phase comparator circuit and the first pulse signal output from said arbitration circuit; and a second combining circuit for combining the second phase difference signal output from said phase comparator circuit and the second pulse signal output from said arbitration circuit.

5. A PLL circuit according to claim 4, wherein:

said edge detection circuit comprises NAND circuits, a first inverter including a P-channel transistor and an N-channel transistor, and a second inverter including a P-channel transistor and an N-channel transistor; and said pulse generating circuit comprises inverters and AND circuits.

6. A DLL (delay locked loop) circuit comprising a phase comparator means, said phase comparator means comprising:

a phase comparator circuit for receiving a first clock signal and a second clock signal and for activating a first phase difference signal corresponding to a phase difference between the first clock signal and the second clock signal when a phase of the first clock signal is delayed by more than a predetermined value in comparison with a phase of the second clock signal and activating a second phase difference signal corresponding to the phase difference when the phase of the first CLOCK signal is advanced by more than a predetermined value in comparison with the phase of the second clock signal;

an arbitration circuit for receiving the first clock signal and the second clock signal and for activating a first pulse signal when an edge of the first clock signal is delayed in comparison with an edge of the second clock signal and activating a second pulse signal when the edge of the first clock signal is advanced in comparison with the edge of the second clock signal, said arbitration circuit comprising an edge detection circuit for detecting a rising edge of one of the first and second clock signals being advanced and a pulse generating circuit for generating one of the first and second pulse signals;

a first combining circuit for combining the first phase difference signal output from said phase comparator circuit and the first pulse signal output from said arbitration circuit; and a second combining circuit for combining the second phase difference signal output from said phase comparator circuit and the second pulse signal output from said arbitration circuit.

7. A DLL circuit according to claim 6, wherein:

said edge detection circuit comprises NAND circuits, a first inverter including a P-channel transistor and an N-channel transistor, and a second inverter including a P-channel transistor and an N-channel transistor; and said pulse generating circuit comprises inverters and AND circuits.

* * * * *